US011922613B2

United States Patent
Gong et al.

(10) Patent No.: US 11,922,613 B2
(45) Date of Patent: Mar. 5, 2024

(54) APPARATUSES AND METHODS FOR DETERMINING WAFER DEFECTS

(71) Applicant: MICRON TECHNOLOGY, INC., Boise, ID (US)

(72) Inventors: Yutao Gong, Atlanta, GA (US); Dmitry Vengertsev, Boise, ID (US); Seth A. Eichmeyer, Boise, ID (US); Jing Gong, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 439 days.

(21) Appl. No.: 16/925,243

(22) Filed: Jul. 9, 2020

(65) Prior Publication Data

US 2021/0201460 A1 Jul. 1, 2021

Related U.S. Application Data

(60) Provisional application No. 62/955,241, filed on Dec. 30, 2019.

(51) Int. Cl.
*G06T 7/00* (2017.01)
*G01N 21/95* (2006.01)
(Continued)

(52) U.S. Cl.
CPC ....... *G06T 7/0004* (2013.01); *G01N 21/9501* (2013.01); *G06T 7/001* (2013.01);
(Continued)

(58) Field of Classification Search
CPC .......... G06T 7/001; G06T 2207/20081; G06T 2207/20084; G06T 2207/30148;
(Continued)

(56) References Cited

U.S. PATENT DOCUMENTS

2017/0177997 A1* 6/2017 Karlinsky ............ G06V 10/993
2018/0254870 A1 9/2018 Dutz et al.
(Continued)

FOREIGN PATENT DOCUMENTS

| CN | 108154504 A | 6/2018 |
|---|---|---|
| CN | 109242033 A | 1/2019 |

(Continued)

*Primary Examiner* — Samir A Ahmed
(74) *Attorney, Agent, or Firm* — Dorsey & Whitney LLP

(57) ABSTRACT

An inspection system for determining wafer defects in semiconductor fabrication may include an image capturing device to capture a wafer image and a classification convolutional neural network (CNN) to determine a classification from a plurality of classes for the captured image. Each of the plurality of classes indicates a type of a defect in the wafer. The system may also include an encoder to encode to convert a training image into a feature vector; a cluster system to cluster the feature vector to generate soft labels for the training image; and a decoder to decode the feature vector into a re-generated image. The system may also include a classification system to determine a classification from the plurality of classes for the training image. The encoder and decoder may be formed from a CNN autoencoder. The classification CNN and the CNN autoencoder may each be a deep neural network.

10 Claims, 8 Drawing Sheets

(51) Int. Cl.
*G06V 10/762* (2022.01)
*G06V 10/764* (2022.01)
*G06V 10/776* (2022.01)
*G06V 10/82* (2022.01)
*G01N 21/88* (2006.01)
*H01L 21/67* (2006.01)

(52) U.S. Cl.
CPC .......... *G06V 10/762* (2022.01); *G06V 10/764* (2022.01); *G06V 10/776* (2022.01); *G06V 10/82* (2022.01); *G01N 2021/8887* (2013.01); *G06T 2207/20081* (2013.01); *G06T 2207/20084* (2013.01); *G06T 2207/30148* (2013.01); *H01L 21/67288* (2013.01)

(58) Field of Classification Search
CPC .............. G06T 7/0004; G01N 21/9501; G01N 2021/8887; G01N 2021/8854; H01L 21/67288; G06K 9/6218; G06K 9/6256; G06K 9/6267; G06N 3/0454; G06N 3/088; G06V 10/762; G06V 10/764; G06V 10/776; G06V 10/82; G06V 2201/06
See application file for complete search history.

(56) References Cited

U.S. PATENT DOCUMENTS

| | | | |
|---|---|---|---|
| 2019/0073566 A1* | 3/2019 | Brauer | G06V 10/764 |
| 2019/0286506 A1* | 9/2019 | Cheng | G06N 3/0445 |
| 2019/0287238 A1* | 9/2019 | Sriraman | G06V 10/40 |
| 2019/0370661 A1* | 12/2019 | Kwon | G06N 20/00 |
| 2019/0370955 A1* | 12/2019 | Zhang | G06K 9/628 |
| 2019/0378260 A1* | 12/2019 | Brauer | G06T 7/001 |
| 2020/0020092 A1* | 1/2020 | Fang | G06T 7/001 |
| 2020/0134810 A1* | 4/2020 | Lee | G06T 7/0006 |
| 2020/0226742 A1* | 7/2020 | Sawlani | H01L 21/67288 |

FOREIGN PATENT DOCUMENTS

| | | | |
|---|---|---|---|
| CN | 109559298 A | | 4/2019 |
| CN | 110135521 A | | 8/2019 |
| EP | 3501829 | * | 6/2019 |

* cited by examiner

APPARATUSES AND METHODS FOR DETERMINING WAFER DEFECTS

CROSS-REFERENCE TO RELATED APPLICATION

This application claims the filing benefit of U.S. Provisional Application No. 62/955,241, filed Dec. 30, 2019. This application is incorporated by reference herein in its entirety and for all purposes.

BACKGROUND

Semiconductor fabrication often requires determining defects of a semiconductor device at wafer level to assess whether the semiconductor device is acceptable for use. Further, determining a type of defect in the wafer may provide an indication of the cause of the defect, which information may be used to improve the semiconductor fabrication systems, equipment or processes.

Conventional wafer defect detection generally uses image classification methods that pre-determine certain features from the wafer images, and design an image classifier using the pre-determined features. Generally, a training process is required to train the classifier using multiple training images. Clustering methods may also be used to group images based on their similarity. These approaches, however, usually suffer in performance due to high-dimensional data and high computational complexity on large-scale datasets.

DETAILED DESCRIPTION

In some embodiments of the disclosure, an inspection system for determining wafer defects in semiconductor fabrication may include an image capturing device to capture a wafer image and a classification convolutional neural network (CNN) to determine a classification from a plurality of classes for the captured image. Each of the plurality of classes indicates a type of defect in the wafer. The system may also include a training system to train the classification CNN using multiple training wafer images. The training system may also include an encoder configured to encode a training image into a feature vector; and a decoder configured to decode the feature vector into a re-generated image. The training system may also include a clustering system to cluster the feature vectors from the encoder on the training images to generate soft labels for training a classification CNN. The encoder and decoder may be formed from a CNN. The system may use multiple training images to train the encoder, decoder and the classification CNN.

Figure 1:
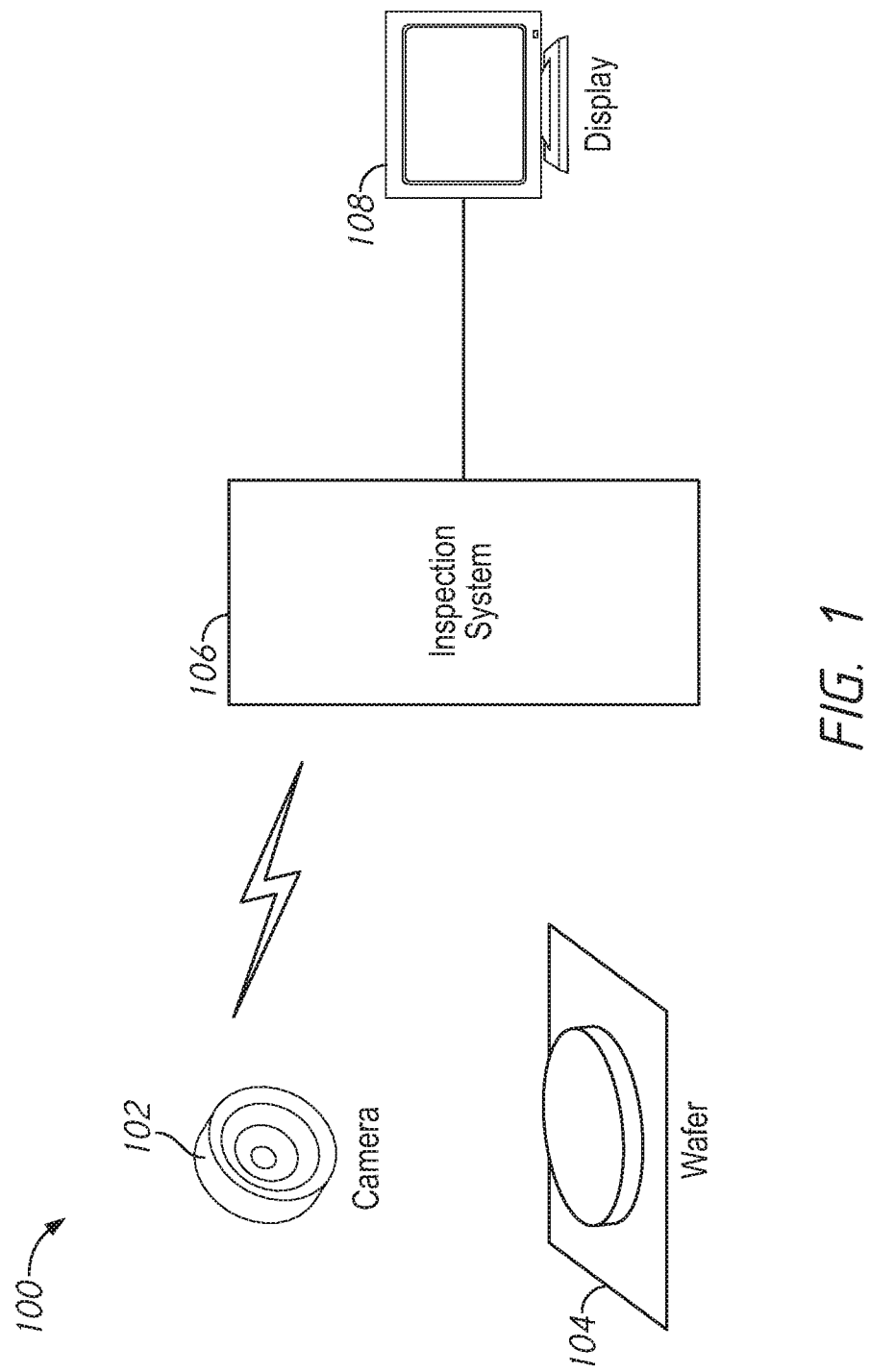
FIG. 1 is a diagram of a system for determining wafer defects according to some examples described in the disclosure.

FIG. 1 is a diagram of a system 100 for determining wafer defects according to some examples described in the disclosure. The system for determining wafer defects may include an image capturing device 102 configured to capture an image of a wafer 104. In some examples, the image capturing device 102 may also be configured to capture multiple images of a wafer, each from a different perspective, for example, at a different angle or distance. In some examples, the image capturing device 102 may also be configured to capture one or more images for multiple wafers. For example, the image capturing device 102 may be configured to capture images of one or more wafers moving along an inspection line.

The system 100 may further include an inspection system 106 coupled to the image capturing device 102 and configured to determine a classification for each of the captured image. The classification may be one of the multiple classifications, each indicating a type of a defect in the wafer. In some examples, the system 100 may further include a display 108 configured to output the classification result provided by the inspection system 106. In some examples, the inspection system 106 may classify each of the captured image using a classification CNN, where the classification CNN may include multiple convolutional layers. The inspection system 106 may also include a training system to train the classification CNN, for example, to obtain the weights of the classification CNN. The details of the classification CNN and the training network will be described in the present disclosure with reference to FIG. 2.

Figure 2:
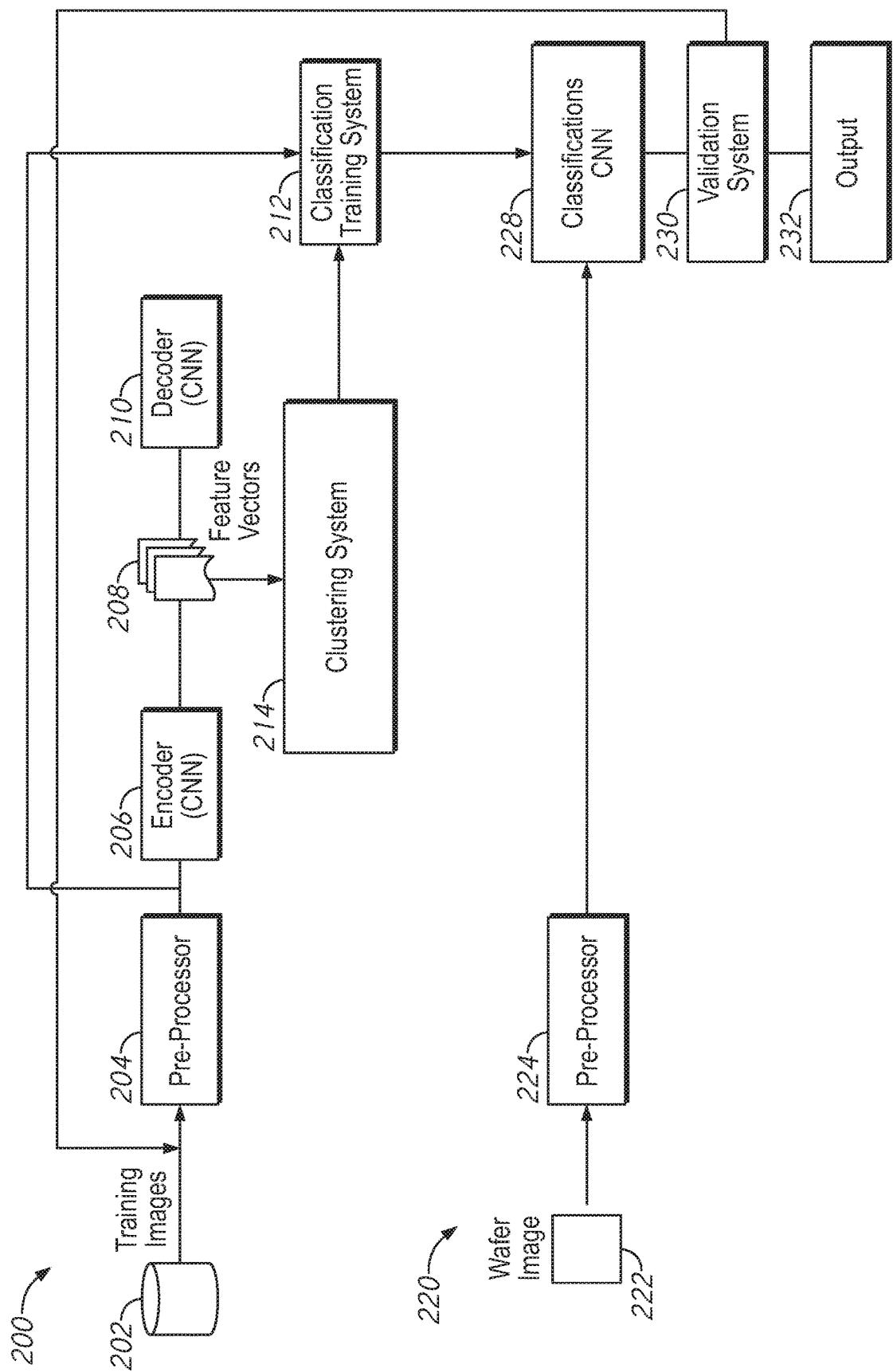
FIG. 2 is a block diagram of an inspection system according to some examples described in the disclosure.

FIG. 2 is a block diagram of an inspection system according to some examples described in the disclosure. An inspection system may include a classification system 220 and a training system 200. In some examples, the classification system 220 and/or the training system 200 may be implemented in the inspection system 106 (in FIG. 1). In some examples, the classification system 220 may include a classification CNN 228 configured to receive a wafer image 222 and determine a classification for the wafer image, where the classification indicates a type of a defect in the wafer. This is further described in FIG. 3.

Figure 3:
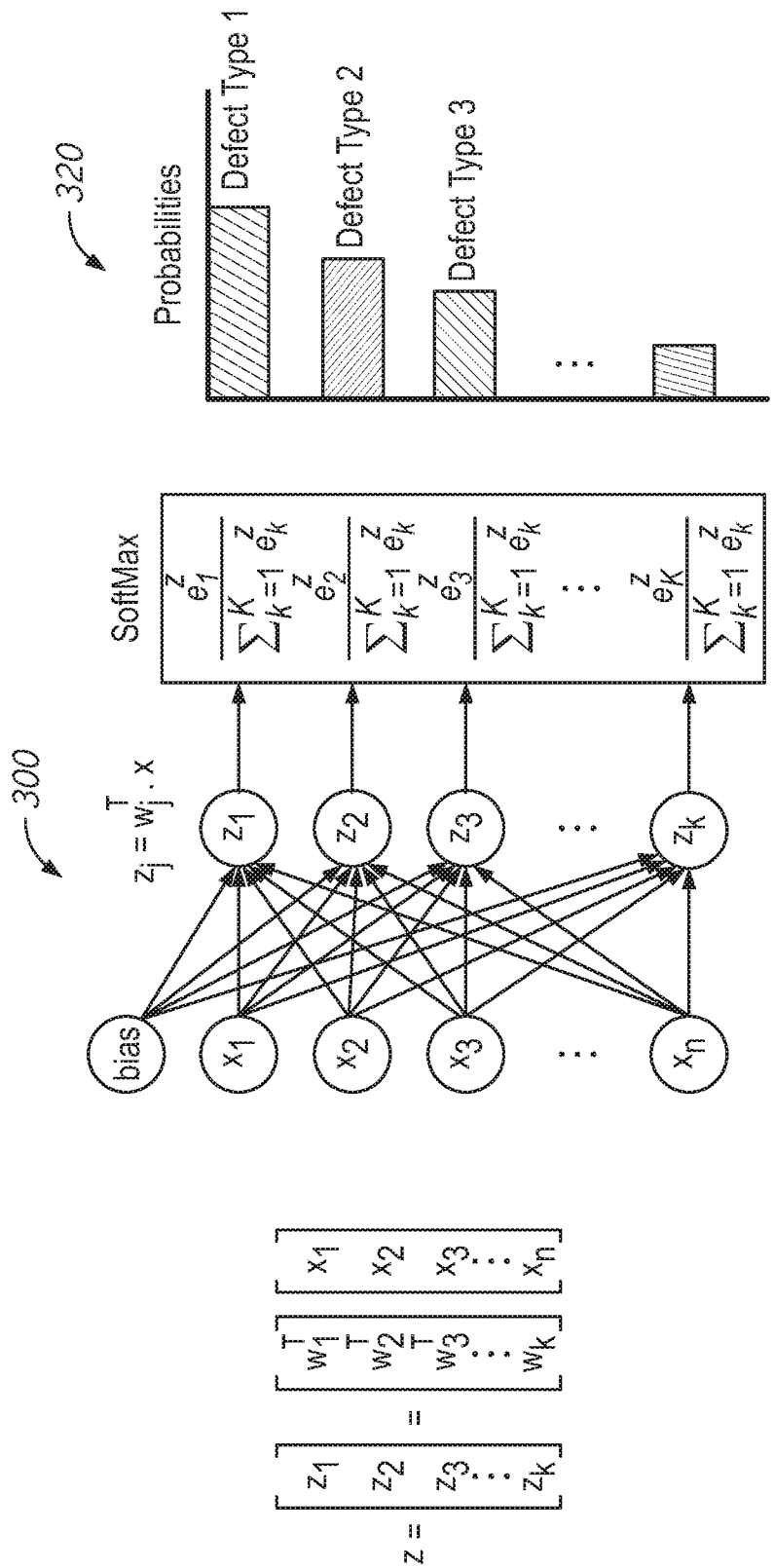
FIG. 3 is a diagram of a classification convolutional neural network according to some examples described in the disclosure.

FIG. 3 is a diagram of a classification CNN 300 according to some examples described in the disclosure. The classification CNN 300 may be represented by $Z=W*X$, where X represents the input image, Z represents the output of the classification CNN, W represents the weights of the classification CNN, and "*" represents convolutional operation. Thus, the output Z may be represented by one or more convolutional operations over the input image, where the convolution operations are defined by the weights W of the classification CNN. In some examples, the input X may include multiple channels, e.g., $x_2, \ldots, x_n$, and the output Z may also include multiple elements, e.g., $z_1, z_2, \ldots, z_k$, each corresponding to a type of defect in a wafer. W may include multiple weights.

In a non-limiting example, the classification CNN may include a deep neural network, e.g., a VGG-16 network. In the VGG-16 network, the CNN may include multiple convolutional layers. For example, the multiple convolutional layers in the VGG-16 may include multiple groups of convolutional layers, e.g., five groups of convolutional layers, respectively containing two (layers 1&2), two (layers 3&4), three (layers 5-7), three (layers 8-10), and three (layers 11-13) convolutional layers. In the VGG-16, a max pooling layer may be placed between adjacent groups of convolution layers. For example, a max pooling layer is placed between the last convolutional layer in the first group, e.g., layer 2 and the first convolutional layer of the succeeding group, e.g., layer 3. Similarly, a max pooling layer is placed between layers 4 and 5; between layers 7 and 8; and between layers 10 and 11. The VGG-16 may further include one or more fully connected layers after the layers 11-13, and another max pooling layer in-between layer 13 and the fully connected layers. In some examples, the VGG-16 may further include a softmax layer after the fully connected layers. Although VGG-16 is illustrated, the classification CNN may include any suitable types of two-dimensional (2D) neural networks, such as ResNet, VGG, U-net, etc., or a combination thereof.

With further reference to FIG. 3, the classification result may include multiple probability values, each corresponding to one of multiple types of defects in a wafer image. These probability values may be provided via the softmax layer after the fully connected layers in the classification CNN 300. In a non-limiting example shown in FIG. 3, in the classification result, the probability value for defect type 1 may have the largest value, followed by defect type 2, and 3, etc. The numerals of defect types here are for illustration only. For example, a defect type numeral, e.g., type 1, can be any of the known defect types.

Figure 5:
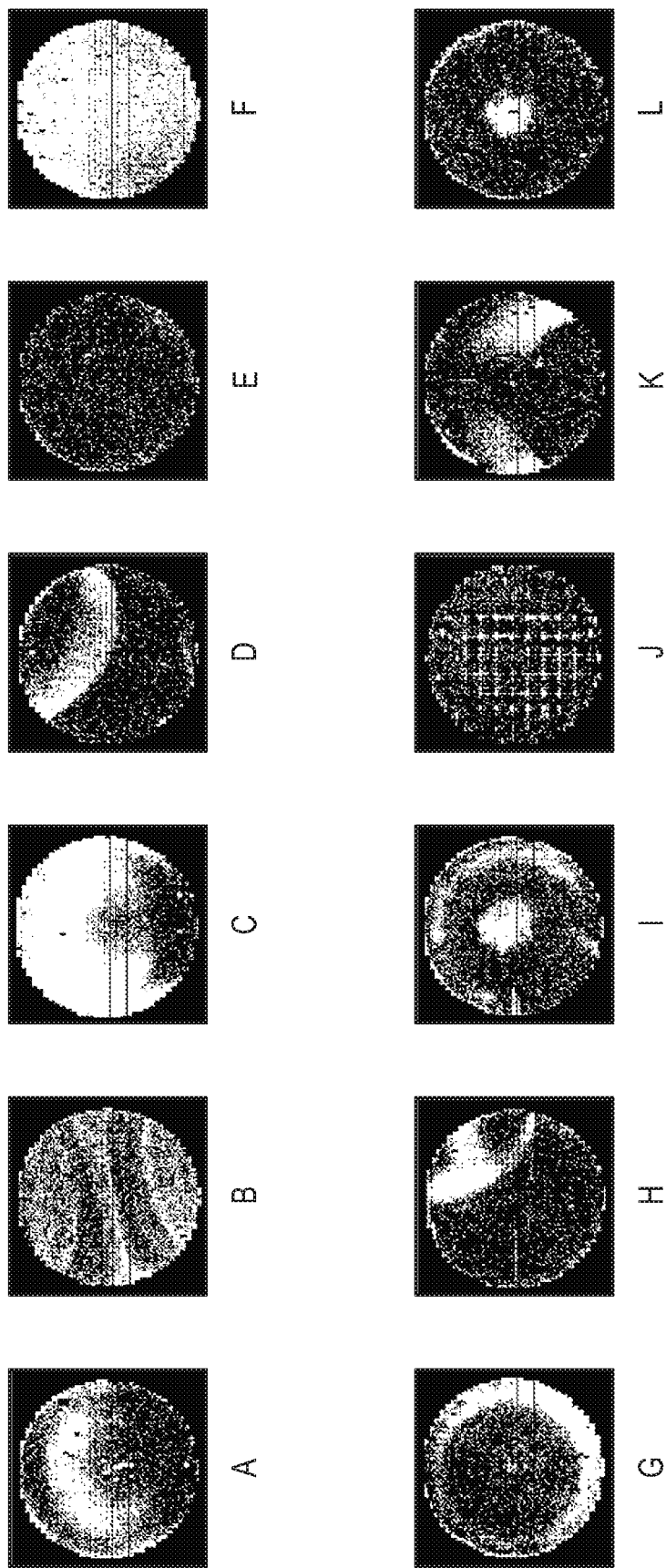
FIG. 5 illustrates various types of defects in a wafer according to some examples described in the disclosure.

FIG. 5 illustrates various types of defects in a wafer according to some examples described in the disclosure. Each type of defects may be associated with a distinctive wafer image pattern. In some examples, the various types of wafer defects may include global random defects, such as defects caused by cleanliness of the clean room. In semiconductor fabrication, these types of defects may be acceptable when a small number of defects appear. In some examples, the various types of wafer defects may include local systematic defects caused by defective equipment, processes and/or human mistakes. Examples of systematic defect patterns include a circle, a ring, a scratch, or a zone defect pattern, etc. The various types of wafer defects may also include mixed-type defect patterns that include a combination of the patterns mentioned above.

Returning to FIG. 2, the training system 200 may include an encoder 206 and a decoder 210 coupled to the encoder. The encoder 206 and the decoder 210 may form an autoencoder, such as a CNN autoencoder. The encoder 206 may be configured to receive training images 202 and encode each training image into a respective feature vector. The training images 202 may be stored at a local storage or a remote server. The training system may further include a clustering system 214 configured to cluster the feature vector provided by the encoder 206 into a cluster of multiple clusters. The clustering result of a feature vector may be represented by a soft label indicating which cluster to which the feature vector is clustered. In some examples, the encoder may be formed by a portion of a clustering CNN 214. The decoder 210 may be configured to decode the feature vector into a re-generated image. The decoder 210 may be formed by another portion of the clustering CNN 214. The re-generated images from multiple runs of the encoder 206 and decoder 210 may be used to train the encoder 206 and decoder 210, which will be described in further detail in the present disclosure.

The training system 200 may further include a classification training system 212 coupled to the clustering system 214. The classification training system 212 may be configured to infer a classification of one or more training images using the classification CNN 228. In some examples, the training system 200 may be configured to train the classification CNN 228 using one or more training processes and the and the clustering result of the training images, to be described further in the present disclosure.

With further reference to FIG. 2, the classification system 220 may further include a validation system 230 configured to validate the output of the classification CNN 228. As disclosed in the present disclosure, the classification result from the classification CNN 228 may include multiple probability values, each corresponding to one of multiple types of defects in a wafer image. In some examples, the validation system may be configured to determine whether there is a dominant probability value among the multiple probability values. If a dominant probability value (e.g., the largest probability value) is above a threshold, e.g., 70%, 75%, 80%, then the validation system may determine that the validation is successful. In such case, the validation system may determine that the classification result from the classification CNN be validated, and the wafer image belongs to the class to which the dominant probability value corresponds. Accordingly, the wafer image may have a type of defect associated with the determined class from the classification CNN.

In some examples, the multiple classes of the types of defects may include a class indicating no defects. In such case, a dominant probability value in the classification result may correspond to a class indicating no defects, and the validation system 230 may determine that the wafer image has no defects. Subsequent to validation by the validation system 230, the classification system may output the classification result at an output device 232. The output device may include an audio and/or video device, e.g., a speaker, a display, a mobile phone having both audio/video capabilities to show the classification result.

In some examples, if the dominant probability value is below a threshold (e.g., 40%, 30% etc.), the validation system 230 may determine that validation fails. In such case, the validation system may determine that the wafer image may belong to a new class that has not been trained before. In a non-limiting example, the validation system may cause the training system 200 to re-train the CNN autoencoder (e.g., encoder 206 and decoder 201) and/or the classification CNN 228 with the wafer image that has failed the validation system.

With further reference to FIG. 2, the training system 200 and the classification system 220 may each include a respective pre-processor 204, 224. In some examples, the pre-processor 204, 224 may be configured to perform various operations, such as normalization, de-noise and resize operations. In some examples, a normalization operation may be configured to convert an original image in a first range, e.g., [0, 255] to a second range, e.g., [0, 1] (in floating point). The second range may be smaller than the first range, and this reduction of range may cause the various training processes described in the present disclosure to converge faster. A de-noise operation may include one or more image processing algorithms to remove the noise from a training wafer image or a captured wafer image. For example, whereas a wafer defect pattern may likely include multiple pixels forming a shape, such as a circle, a ring, a scratch line, or a zone, isolated (or speckle) pixels may be deemed as noise and removed.

In some examples, a resize operation may include scaling the wafer image size to be adapted to the subsequent CNN (e.g., CNN autoencoder or classification CNN 228). For example, when the size of the CNN is 512×512, the resize operation may convert a wafer image at a higher resolution to the size of 512×512 by compression. In some examples, the resize operation may be lossless in that no potential defect pixels will be lost from the compression. In some examples, one or more operations in the pre-processors 204, 224 may be identical. Alternatively, one or more operations in the pre-processors 204, 224 may be different.

Figure 4:
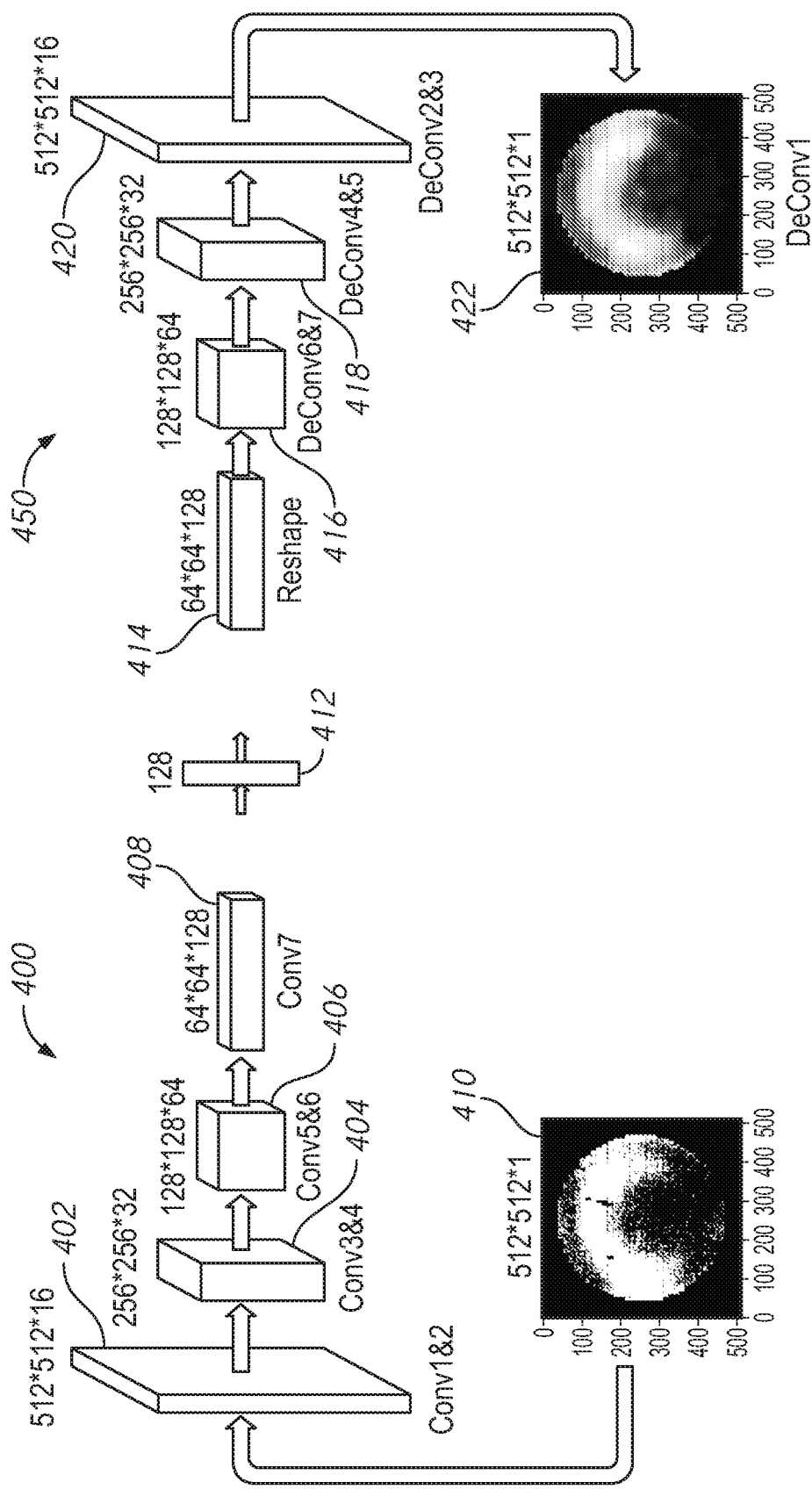
FIG. 4 is an example convolutional neural network that implements an encoder and a decoder according to some examples described in the disclosure.

FIG. 4 is an example convolutional neural network that implements a CNN autoencoder, which comprises an encoder and a decoder according to some examples described in the disclosure. For example, the CNN autoencoder may be implemented in the training system (200 in FIG. 2). The CNN autoencoder may include an encoder 400 formed by a first portion of a CNN. The first portion of the CNN includes multiple convolutional layers, e.g., 402, 404, 406, 408, formed as an encoder. In an example configuration, each of the convolution layers, e.g., 402, 404, 406 and 408 may be a group of layers and include respective one or more convolution layers. For example, layer 402 may include two convolution layers (1 & 2) in a CNN. The first convolutional layer may have a size the same as a training image 410, e.g., 512×512.

The multiple convolutional layers in the encoder 400 may be configured to generate a feature vector based on an input image. In some examples, the feature vector may have a size less than the size of the first convolutional layer of the encoder. For example, the feature vector may include a one-dimension (1D) vector having a size of 128, shown as 412. In the example shown in FIG. 4, each group of layers may have a size less than a size of the preceding layer (or group of layers), with a max polling layer in between adjacent groups. In a non-limiting example, the convolutional layers 1&2 may have a size of 512×512×16 (channels), the convolutional layers 3&4 may have a size of 256×256×32, the layers 5&6 having a size of 128×128×64 and convolutional layer 7 having a size of 64×64×128. The encoder 400 may further include a dense layer containing a feature vector 412 having a size of 1×128 through a two-dimension (2D) to 1D conversion.

With further reference to FIG. 4, the feature vectors from multiple training images through the encoder 400 may be clustered via an unsupervised clustering algorithm, e.g., soft K-means clustering. The clustering algorithm may be implemented in the clustering system e.g., 208 (in FIG. 2). The clustering algorithm may determine a number of clusters, each containing one or more feature vectors from the training images, where the feature vectors in a cluster may be spatially closer in distance relative to feature vectors in other clusters. The unsupervised clustering refers to a clustering that may automatically determine the number of clusters and the clustering result. Each of the clustered feature vectors may belong to one of the multiple clusters of feature vectors, represented by a label referred to as soft label.

In some examples, a number of clusters may be manually selected in an initial stage. For example, as shown in FIG. 5, multiple wafer images are manually categorized and labeled into 12 different types, namely A through L. A new training image may be provided to the encoder 206 and the clustering system 208 (in FIG. 2). In some scenarios, the feature vector generated by the encoder 206 may be clustered by the clustering system 208 into one of the initially categorized clusters. In some scenarios, the feature vector generated by the encoder 206 may be clustered into none of the existing clusters, or instead clustered into one or more of the existing clusters with low confidence. In such case, the clustering system may determine that the training image may have a new defect pattern that does not belong to any of the existing clusters. Thus, the clustering system may determine to add the new defect pattern from the training image to the existing clusters.

With further reference to FIG. 4, the decoder 450 may be formed by a second portion of the CNN. In some examples, the second portion of the CNN may include multiple de-convolutional layers, e.g., layers 414, 416, 418 and 420. In a similar configuration as in the encoder 400, each of the layers 414, 416, 418 and 420 may be a group of de-convolutional layers and include respective one or more de-convolution layers. For example, layer 420 may include two de-convolution layers (2 & 3) in the CNN. The last convolutional layer may have a size the same as a training image 410, e.g., 512×512. Thus, the multiple de-convolutional layers in the decoder 450 may be configured to convert a feature vector 412 to a re-generated image 422, having the same size as the training image.

In the example shown in FIG. 4, the multiple de-convolutional layers in the decoder 450 may be configured to mirror the configuration of the encoder 400, but in a reversed order. For example, in the decoder 450, each group of layers may have a size larger than a size of the preceding layer (or group of layers), with up-pooling layer in between adjacent groups. In a non-limiting example, the output of the de-convolutional layers 2&3 may have a size of 512×512×16 (channels); the output of the convolutional layers 4&5 may have a size of 256×256×32; the output of the de-convolutional layers 6&7 may have a size of 128×128×64; and a reshape layer may have an output of a size of 64×64×128. In some examples, the decoder 450 may be configured to convert a feature vector 412 to a 2D data to be provided to the reshape layer 414. In the example in FIG. 4, the re-generated image 422 may have the same size as the training image 410. In comparing the re-generated image and the training image, the re-generated image may have a discrete number of sets, each corresponding to a cluster of the multiple clusters. In some examples, each of the convolutional layers in the encoder or de-convolutional layers in the decoder in the CNN may have multiple weights that can be trained through a training process, which is further described in the present disclosure.

Figure 6:
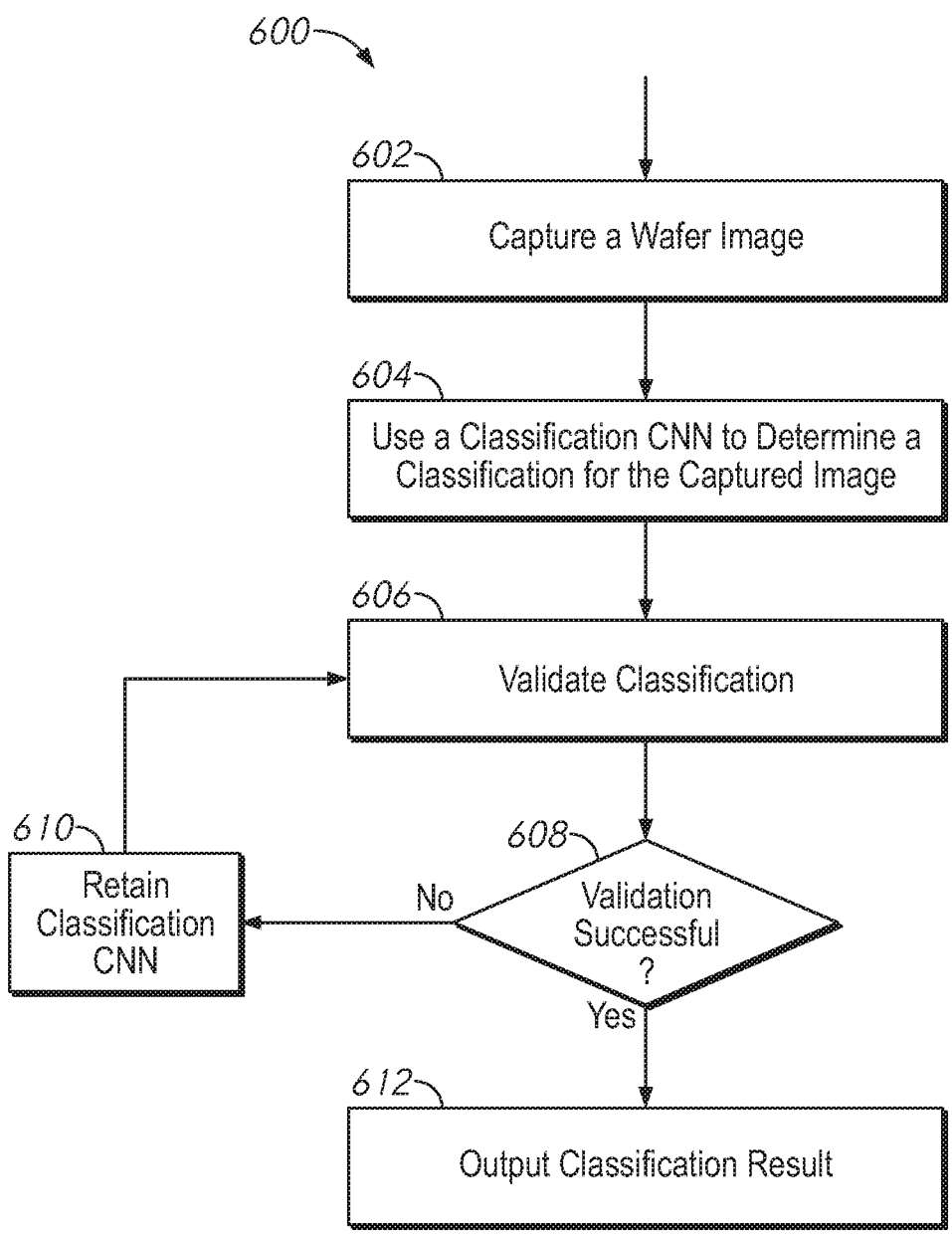
FIG. 6 is an example process of determining defects in a wafer according to some examples described in the disclosure.

FIG. 6 is an example process 600 of determining defects in a wafer according to some examples described in the disclosure. In some examples, the process 600 may be implemented in the inspection system (e.g., 106 in FIG. 1) or the classification system 220 (in FIG. 2). The process 600 may include, at an image capturing device, capturing an image of a wafer at 602. Capturing the image of a wafer 602 may be performed by any suitable image capturing device, such as 102 (in FIG. 1). The process 600 may further include, at an inspection system, using a classification CNN to determine a classification for the captured image at 604. In some examples, the operation 604 may be implemented in the inspection system 106 (in FIG. 1) or in the classification system 220 (in FIG. 2). The classification CNN may include the classification CNN 228 (in FIG. 2) or the CNN 300 shown in FIG. 3. As described in the embodiments with reference to FIGS. 3 and 5, the classification for the captured wafer image may include multiple probability values, each indicating a probability that the captured wafer image belongs to the corresponding class associated with the probability value. A corresponding class may indicate a type of a defect in the wafer.

With further reference to FIG. 6, the process 600 may further include validating the classification result at 606. The operation 606 may be implemented in a validation system, e.g., 230 (in FIG. 2). Similar to the embodiments described with reference to FIG. 2, validating the classification result may include determining whether a dominant probability value in the classification is above a threshold. If a dominant probability value (e.g., the largest probability value) is above a threshold, e.g., 70%, 75%, 80%, then the validation system may determine that the validation is successful. If the dominant probability value is below a threshold (e.g., 40%, 30% etc.), the validation system 230 may determine that validation fails. If the validation is determined to be successful at 608, the process 600 may output the classification result at 612, e.g., via an audio and/or video device, as described in the present disclosure. As similarly disclosed in the embodiments with reference to FIG. 2, the output result may indicate a type of wafer defect or no wafer defect in the captured wafer image. If the validation is determined to have failed at 608, then the process 600 may determine that the captured image belongs to an unknown type of defect, and cause the system to re-train the classification CNN at 610. This is further explained with reference to FIG. 7.

Figure 7:
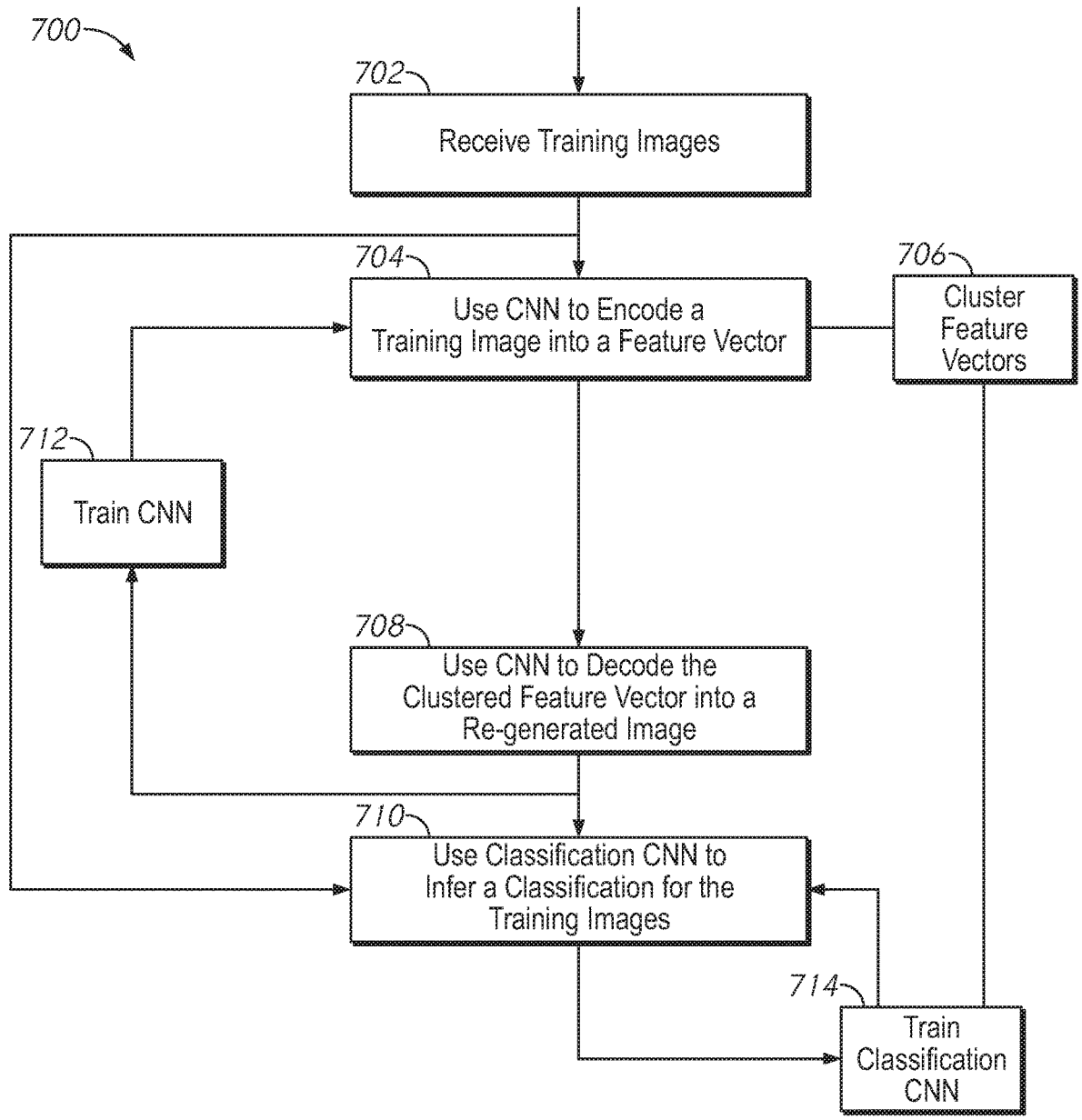
FIG. 7 is an example process of training an inspection system for determining wafer defects according to some examples described in the disclosure.

FIG. 7 is an example process 700 of training an inspection system for determining wafer defects according to some examples described in the disclosure. The training process 700 may be implemented in the inspection system 106 (in FIG. 1) or the training system 200 (in FIG. 2). Similar to the embodiments described with reference to FIGS. 2-4, the training process 700 may include receiving training images at 702. The training images (e.g., 202 in FIG. 2) may be stored in a training database that is accessible to various training processes. For example, the training images may be stored locally in the training system (e.g., 200 in FIG. 2), or remotely in a server, and can be accessed by the training system wired or wirelessly. The process 700 may further include using a CNN autoencoder (e.g., encoder) to encode a training image of a plurality of training images into a feature vector at 704, using the CNN autoencoder (e.g., decoder) to decode the feature vector into a re-generated image at 708, and training the CNN autoencoder at 712, using the results of re-generated images and the training images.

The training process 700 may further include clustering the feature vectors from the encoder (e.g., process 704) into a cluster at 706 to generate soft labels for the training images. The training process 700 may further use the classification CNN to infer a classification from the plurality of classes for the training images at 710, and train the classification CNN at 714 using the training images and the soft labels generated from the clustering at 706. In other words, the soft labels generated from the clustering will be used as ground truth for training the classification CNN at 714. The operations 704-714 may be performed in a similar manner as described with reference to FIGS. 2-5.

In a non-limiting example, encoding the training image may include using a first portion of the clustering CNN configured to form an encoder (e.g., 400 in FIG. 4). Decoding the feature vector into re-generated image may include using a second portion of the CNN configured to form a decoder (e.g., 450 in FIG. 4). For example, as shown in FIG. 4, the encoder may include multiple convolutional layers, and the decoder may include multiple de-convolutional layers, where the structure of the decoder may be mirrored to that of the encoder in a reversed order. The encoder and decoder may be configured in a similar manner as the training system 200 (in FIG. 2) and operated in a similar fashion. Further, the operation 706 may be implemented in a similar fashion as the clustering system 208 (in FIG. 2). For example, the clustering may include using soft K-means clustering or other suitable clustering algorithms.

In some examples, the process 700 may further include training the CNN autoencoder at 712 (including the encoder and decoder, such as 206, 210 in FIG. 2). This operation may be implemented in the training system, e.g., 200 (in FIG. 2). In a non-limiting example, the operation 712 may include using multiple training images to train the CNN autoencoder that comprises the encoder and the decoder. In some examples, the training system may initialize the weights in the CNN autoencoder. The training method may include multiple iterations of computing re-generated images and comparing the re-generated images with the training images and update the weights of the CNN autoencoder in each iteration until a stopping criteria is met. The training method may include any suitable training method, such as gradient descend method. In training the CNN autoencoder, an object function may be defined to be based at least on a difference between one of a plurality of training images and a corresponding re-generated image (see operation 708) from the first portion (encoder) of the CNN autoencoder through the second portion (decoder) of the CNN autoencoder. In each succeeding iteration of the training, the difference between the training image and the corresponding re-generated image is expected to become less and less at certain point and eventually converge, and the training process may stop. Alternatively, the difference in each iteration is expected to reach below a threshold, at which point the training process may stop.

Additionally, the process 700 may include training the classification CNN at 714. This operation may be implemented in the training system, e.g., 200 (in FIG. 2) or the classification training system 212 (in FIG. 2). In a non-limiting example, the operation 714 may include using multiple training images to train the classification CNN by using the clustering result as ground truth. The training of the classification CNN may be performed in a similar manner as the training of the CNN autoencoder. In some examples, an object function used in training the classification CNN may be defined to be based at least on a difference between the determined classification and a ground truth (soft label) for each of the training images. The ground truth may indicate the class (type of defect) to which each training image, belongs. In each iteration of the training, this difference is expected to become less and less at certain point and eventually converge, and the training process may stop. Alternatively, the difference in each iteration is expected to reach below a threshold, at which point the training process may stop.

The training processes 712 and 714 may be performed once. As the system is operating to detect wafer defects using the classification CNN (see FIG. 2), the training process may not need to be repeated. Alternatively, and/or additionally, as unknown defect is introduced during the semiconductor fabrication process, the operations 712 and 714 may be performed again to re-train the CNN autoencoder and/or the classification CNN. For example, the re-training may be performed when a validation of the classification result fails. As described in FIG. 6, when a validation fails at 608, the retraining may be performed at 610. Whereas the validation may determine that a captured wafer image contains unseen dataset, as disclosed in the present disclosure, it is appreciated that variations of the retraining may be possible. For example, upon validation failure, the retraining (610 in FIG. 6) may be implemented to include operations 714 and 712 (in FIG. 7). Alternatively, the retraining may be implemented to only include operation 714. In some scenarios, when sporadic validation failure occurs, the retraining may be implemented to train the classification CNN with the new captured wafer image. When the number of validation failures increases, the retraining may be implemented to train both the CNN autoencoder (comprising encoder and decoder) and the classification CNN using the multiple captured wafer images that have failed validation.

Various embodiments disclosed with reference to FIGS. 1-7 provide advantages over existing systems. For example, the encoder (e.g., 206 in FIG. 2) extracts important features from wafer images. This improves the result of subsequent clustering because the most salient features of the training data are preserved in the feature vectors from the encoder. The training of the CNN autoencoder optimizes the encoder so that desirable features can be contained in the feature vector. Furthermore, the clustering system (e.g., 208 in FIG. 2), when combined with the encoder/decoder, further reduces the size of data in the training images to a discrete number of clusters. This improves both the accuracy and efficiency of the subsequent classification. Furthermore, the classification CNN is a non-linear feature extractor that may have improved accuracy than other conventional image classification systems without a need for manually defining features to extract.

Figure 8:
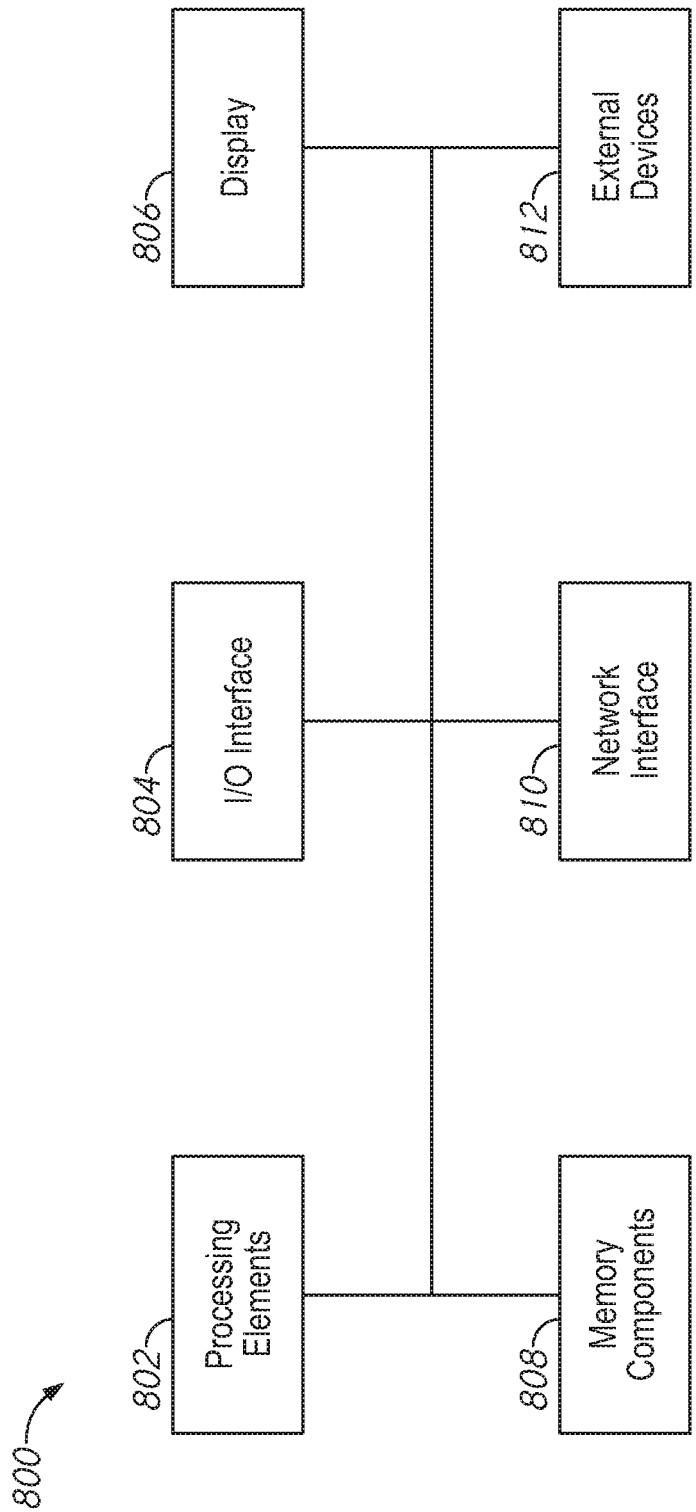
FIG. 8 is an example diagram of a computing device that can be used to implement various systems and methods described herein.

FIG. 8 is an example diagram of a computing device that can be used to implement various systems and methods described herein. The computing device 800 may be used with the system 100 (in FIG. 1) or one or more components of the system. For example, the inspection system 106 (in FIG. 1), the training system 200 (in FIG. 2), or one or more components in FIG. 2, e.g., the classification system 220, the pre-processor 204, 224, the encoder and decoder (206, 210), the clustering system 208, the classification CNN 228 and the validation system 230 may include one or more of the components shown in FIG. 8 and be used to implement one or blocks or execute one or more of the operations disclosed in FIGS. 1-7.

In FIG. 8, the computing device 800 may include one or more processing elements 802, an input/output (I/O) interface 804, a display 806, one or more memory components 808, a network interface 810, and one or more external devices 812. Each of the various components may be in communication with one another through one or more busses, wireless means, or the like. The processing element 802 may be any type of electronic device capable of processing, receiving, and/or transmitting instructions. For example, the processing element 802 may be a central processing unit, microprocessor, processor, or microcontroller. Additionally, it should be noted that some components of the computer 800 may be controlled by a first processor and other components may be controlled by a second processor, where the first and second processors may or may not be in communication with each other.

The memory components 808 are used by the computer 800 to store instructions for the processing element 802, as well as store data, such as the fluid device data, historical data, and the like. The memory components 808 may be, for example, magneto-optical storage, read-only memory, random access memory, erasable programmable memory, flash memory, or a combination of one or more types of memory components.

The display 806 provides visual feedback to a user and, optionally, can act as an input element to enable a user to control, manipulate, and calibrate various components of the computing device 800. The display 806 may be a liquid crystal display, plasma display, organic light-emitting diode display, and/or cathode ray tube display. In embodiments where the display 806 is used as an input, the display may include one or more touch or input sensors, such as capacitive touch sensors, resistive grid, or the like.

The I/O interface 804 allows a user to enter data into the computer 800, as well as provides an input/output for the computer 800 to communicate with other components (e.g., inspection system 106 in FIG. 1, display 108, speakers, etc.). The I/O interface 804 can include one or more input buttons, touch pads, and so on. The network interface 810 provides communication to and from the computer 800 to other devices. For example, the network interface 810 allows the inspection system 106 (in FIG. 1) to communicate with the camera 102 and the display device 108, or one or more systems in FIG. 2, as well as the training database containing the training images 202 through a communication network. The network interface 810 includes one or more communication protocols, such as, but not limited to Wi-Fi, Ethernet, Bluetooth, and so on. The network interface 810 may also include one or more hardwired components, such as a universal serial bus (USB) cable, or the like. The configuration of the network interface 810 depends on the types of communication desired and may be modified to communicate via Wi-Fi, Bluetooth, and so on.

The external devices 812 are one or more devices that can be used to provide various inputs to the computing device 800, e.g., mouse, microphone, keyboard, trackpad, or the like. The external devices 812 may be local or remote and may vary as desired.

From the foregoing it will be appreciated that, although specific embodiments of the disclosure have been described herein for purposes of illustration, various modifications may be made without deviating from the spirit and scope of the disclosure. For example, the training of the clustering CNN comprising the encoder and decoder, and the classification CNN may be performed concurrently, or individually. One or more systems, such as those shown in FIG. 2, may be combined into one system, or separated out into multiple sub-systems. Accordingly, the scope of the disclosure should not be limited any of the specific embodiments described herein.

Certain details are set forth below to provide a sufficient understanding of examples of various embodiments of the disclosure. However, it is appreciated that examples described herein may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

What is claimed is:
1. A system, comprising:
an image capturing device configured to capture an image of a wafer;
an inspection system comprising a classification system configured to use a classification convolutional neural network (CNN) comprising multiple convolutional layers to determine a classification from a plurality of classes for the captured image, wherein each of the plurality of classes indicates a type of a defect in the wafer; and a training system, the training system comprising:
  an encoder configured encode a training image of a plurality of training images into a feature vector;
  a decoder configured to decode the feature vector into a re-generated image; and
  a clustering system configured to cluster the feature vector into a cluster of a plurality of clusters;
  a classification training system configured to determine a classification from the plurality of classes for the training image;
  wherein the encoder, the clustering system, the decoder and the classification training system are configured to train the classification CNN by repeating operations in one or more iterations to determine weights of the classification CNN.

2. The system of claim 1, wherein the encoder is formed by a first portion of a CNN, the first portion comprising multiple convolutional layers and configured to generate the feature vector based on the training image.

3. The system of claim 2, wherein the decoder is formed by a second portion of the CNN, the second portion comprising multiple de-convolutional layers and configured to generate the re-generated image based on the feature vector.

4. The system of claim 1 further comprising a validation system configured to validate the classification for the captured image by determining whether a dominant probability value in the classification is above a threshold, wherein the classification comprises a probability for each of the plurality of classes to which the captured image belongs.

5. A system, comprising:
  an image capturing device configured to capture an image of a wafer;
  an inspection system comprising a classification system configured to use a classification convolutional neural network (CNN) comprising multiple convolutional layers to determine a classification from a plurality of classes for the captured image, wherein each of the plurality of classes indicates a type of a defect in the wafer;
  a validation system configured to validate the classification for the captured image by determining whether a dominant probability value in the classification is above a threshold, wherein the classification comprises a probability for each of the plurality of classes to which the captured image belongs; and
  a training system configured to, upon failure of validating the classification, retrain the classification CNN by updating weights of the classification CNN based at least partially on the captured image.

6. One or more computer-readable non-transitory storage media, the media encoded with instructions for performing operations comprising:
  capturing an image of a wafer;
  using a classification convolutional neural network (CNN) comprising multiple convolutional layers to determine a classification from a plurality of classes for the captured image, wherein each of the plurality of classes indicates a type of a defect in the wafer;
  encoding a training image of a plurality of training images into a feature vector;
  decoding the feature vector into a re-generated image;
  clustering the feature vector into a cluster of a plurality of clusters;
  determining a classification from the plurality of classes for the training image; and
  training the classification CNN by repeating the encoding, the clustering, the decoding and the determining of classification in one or more iterations to determine weights of the classification CNN.

7. The media of claim 6, wherein encoding the training image comprises using a first portion of a CNN to generate the feature vector based on the training image, the first portion CNN comprising multiple convolutional layers configured to form an encoder.

8. The media of claim 7, wherein decoding the feature vector comprises using a second portion of the CNN coupled to the first portion of the CNN to generate the re-generated image based on the feature vector, the second portion of the CNN comprising multiple de-convolutional layers configured to form a decoder.

9. The media of claim 8, wherein the operations further comprise:
  using the plurality of training images to train the CNN based at least on a difference between one of a plurality of training images and a corresponding re-generated image from the first portion of the CNN through the second portion of the CNN; and
  using the plurality of training images to train the classification CNN based at least on a difference between the determined classification and a ground truth for each of the plurality of training images.

10. The media of claim 6, wherein the operations further comprise:
  validating the classification for the captured image by determining whether a dominant probability value in the classification is above a threshold, wherein the classification comprises a probability for each of the plurality of classes to which the captured image belongs; and
  upon determining a failure of validating the classification, repeating the classification CNN with the captured image.

\* \* \* \* \*